United States Patent [19]
Tredwell et al.

[11] Patent Number: 5,859,462
[45] Date of Patent: Jan. 12, 1999

[54] PHOTOGENERATED CARRIER COLLECTION OF A SOLID STATE IMAGE SENSOR ARRAY

[75] Inventors: Timothy J. Tredwell, Fairport; Teh H. Lee, Webster; James P. Lavine, Rochester, all of N.Y.

[73] Assignee: Eastman Kodak Company, Rochester, N.Y.

[21] Appl. No.: 837,077

[22] Filed: Apr. 11, 1997

[51] Int. Cl.$^6$ .................................................. H01L 31/00
[52] U.S. Cl. ........................... 257/443; 257/444; 257/445
[58] Field of Search .................. 257/222, 229, 257/230, 443, 444, 445, 446

[56] References Cited

U.S. PATENT DOCUMENTS

| | | |
|---|---|---|
| 4,579,626 | 4/1986 | Wallace . |
| 4,916,501 | 4/1990 | Thenoz et al. . |
| 4,997,784 | 3/1991 | Thenoz et al. . |
| 5,051,798 | 9/1991 | Kimura . |
| 5,130,774 | 7/1992 | Stevens et al. . |
| 5,404,039 | 4/1995 | Watanabe . |

FOREIGN PATENT DOCUMENTS

| | | |
|---|---|---|
| 358062981 | 4/1983 | Japan . |
| 401160054 | 6/1989 | Japan . |
| 403114260 | 5/1991 | Japan . |
| 4-316367 | 11/1992 | Japan . |
| WO 90/12423 | 10/1990 | WIPO . |
| WO 92/21151 | 11/1992 | WIPO . |

OTHER PUBLICATIONS

Yasuo Ishihara, et al., Interline CCD Image Sensor With An Antiblooming Structure, pp. 83–88, IEEE Jan., 1984.

Tetsuro Kumesawa, High Resulution CCD Image Sensors With Reduced Smear, pp. 1451–1456, IEEE, Aug., 1985.

*Primary Examiner*—Stephen Meier
*Attorney, Agent, or Firm*—James D. Leimbach

[57] ABSTRACT

An image sensor comprising a semiconductor of a first conductivity type having a plurality of pixels formed thereon; and a region heavily doped with the first conductivity type semiconductor beneath the pixels formed such that there is a gradient formed within the semiconductor below the pixels that is capable of directing photogenerated electrons toward the pixels and away from the heavily doped region. The gradient is formed by having a more lightly doped layer formed upon the heavily doped layer and allowing a gradient to from around the junction of the two layers.

12 Claims, 7 Drawing Sheets

PHOTOGENERATED CARRIER COLLECTION OF A SOLID STATE IMAGE SENSOR ARRAY

FIELD OF THE INVENTION

The invention relates generally to the field of image sensors and in particular to improving the carrier collection efficiency of a solid-state sensor array and to decreasing the carrier cross-talk.

BACKGROUND OF THE INVENTION

Prior art imaging devices have numerous structures to prevent the corruption of accumulated signal charge. These typically relate to the prevention of smear, blooming and crosstalk. Each of these effects requires different structures for correction or prevention.

Crosstalk is the phenomenon that describes photogenerated carriers, such as electrons, that diffuse from under the picture element (pixel) where they are created to other pixel areas where they are inadvertently collected. These diffusion electrons are generated in a field-free, or low field, region beneath the depleted region which forms the charge-collecting region of the pixel. The depletion region has a strong electric field that collects electrons. Crosstalk generally occurs in imagers that use the shift register, most often a charge-coupled device (CCD), to collect the photo-generated electrons.

Smear, typically, describes photogenerated electrons whose parent photons entered the image sensor through a charge-integrating region, such as a photodiode, but the photogenerated electrons are collected in an adjacent CCD. This is similar to crosstalk as discussed above, however, the term applies more to devices in which the shift registers are separated from the charge-integrating or collecting regions and where the shift registers run continuously. Hence, the crosstalk electrons are added to the charge packets in the shift register as they go by and the term smear is applied to this phenomenon.

Anti-blooming structures are those that are added to the image sensor to remove excess charge from the charge-integrating regions. The anti-blooming may be active or passive. The former requires a gate to be turned on and the latter works as soon as charge rises to a preset level. The goal of anti-blooming structures is to remove excess charge from a particular charge-collecting region before the excess charge enters adjacent charge collecting regions. Therefore, anti-blooming is a fundamentally different phenomenon than either cross-talk or smear.

While the three phenomenon of cross-talk, smear and blooming have different characteristics, the manner by which they have been controlled has involved similar elements within the prior art. Specifically, heavily positive doped regions, p+ regions, have been employed by image sensors that photogenerate electrons as the signal charge. In common with transistors and other integrated circuit elements, image sensors use isolation regions to separate charge packets, and/or current flow, in at least one dimension. For example, to separate parallel CCDs.

FIG. 1 illustrates a prior art sensor 5 formed in a heavily doped substrate 13 with a more lightly doped epitaxial layer 16 that forms junction 10 with substrate 13. The sensor 5 has p+ isolation regions 19 designed to have a lower potential than the charge storage regions 18 containing the charge packets. This is commonly done by implanting sufficient p-type dopants, usually boron. This is illustrated in the energy level diagram shown in FIG. 2. The underlying principle is that an electron is accelerated by a field in a direction that is opposite its current motion.

As discussed above, p+ regions are used to confine packets. A second use of a p+ region is to keep electrons in one region from reaching another region. This includes charge packet separation, however, it also includes using the p+ to keep diffusing electrons that are not part of a charge packet out of the region that contains the charge packet. This is one method to combat crosstalk. An example of this is to put p+ on almost all sides of a CCD shift register in an interline image sensor. This prevents smear by keeping electrons from other areas out of the CCD, and has been employed in prior art devices.

Matsunaga, Japanese Publication No. 58-62981, discusses smear reduction techniques within image sensors. Kumesawa et al also discusses smear reduction techniques within image sensors in *IEEE Transactions On Electron Devices* Vol. ED-32, No. 8 August 1985. However, these prior art structures are not useful in imagers where the CCD itself is the charge collecting and photosensitive region, because these structures lead to a reduced photo-response.

U.S. Pat. No. 5,051,798 to Kimura discloses a solid state image sensing device having an lateral overflow drain structure for controlling the blooming phenomenon that yields residual results towards smear reduction as a byproduct. However, this structure is not suitable for imagers which combine the charge collection and the charge transport functions in the same element.

Certain prior art devices teach smear and crosstalk reduction through the classic technique of increasing the depletion region associated with the charge collection element. Gardner et al, International Publication Number WO 92/21151, and Okada, discussed below, are recent examples.

Japanese Publication No. 4-316367 to Okada discloses an imaging device with a diode region that is enlarged for the reduction of smear. However, this is an interline type structure useful for these types of devices that incorporates a vertical overflow drain for anti-blooming. This structure does not address the concerns required for the reduction of cross talk in imagers without vertical overflow drains such as full frame imaging devices.

An example of a prior art device that is the subject of two patents that issued to Thenoz et al, U.S. Pat. No. 4,916,501 and U.S. Pat. No. 4,997,784, use a buried n+ region with a p+ region on the deeper side of the n+ region for anti-blooming. The role of the p+ region is to keep photogenerated electrons out of the n+ region. The p+ region reflects electrons by that mechanism, and may well increase crosstalk. In addition the n+ region may collect photogenerated electrons which lowers the photoresponse of this sensor.

Still another prior art device, Matsumoto as detailed in Japanese Publication No. 3-114260, describes the use of a buried p+ region to deter the electrons from below the p+ region from reaching the surface above the p+ region.

Another prior art device, disclosed by Jastrzebski and Levine in U.S. Pat. No. 4,481,522, utilizes electric fields created from doping gradients to drive electrons away from charge collecting regions. This has the result of reducing the photoresponse of the image sensor.

There is a single prior art disclosure Erhardt, in International Publication Number WO 90/12423, that employs surface p+ isolation regions on the periphery of the imager. However, no disclosure, or suggestion is made of using a deep p+ region to guide the flow of electrons.

It should be apparent from the foregoing discussion that there remains a need within the art for disclosures detailing the use of p+ dopant distributions to produce fields to guide electrons from neutral regions to charge collecting sites.

SUMMARY OF THE INVENTION

Briefly summarized, according to one aspect of the present invention an image sensor comprising: a semiconductor of a first conductivity type having a plurality of pixels formed thereon; and a region heavily doped with the first conductivity type semiconductor beneath the pixels formed such that there is a gradient formed within the semiconductor below the pixels that is capable of directing photogenerated electrons toward the pixels and away from the heavily doped region.

The present invention is directed to overcoming crosstalk. The invention works by diverting the diffusing electron and reducing its likelihood of entering a region where it would contribute to crosstalk. This is done by diffusing the p-type dopant from the p++ substrate into the lightly-doped epi layer to get a p-type distribution, as shown in FIG. 3, that leads to an electric field that drives the photo-generated electrons toward the imager surface. The needed electric field profile may also be obtained through the growth of an epitaxial layer (profiled epi) with a similar p-type dopant distribution. In addition, a combination of high temperature diffusion and profiled epitaxial growth may be used. Further, ion implantation of a p-type dopant may be used in combination with heat treatment and epitaxial growth or just with heat treatment to produce the desired doping profile. The present invention makes use of the p+ below the imager sensor. It should be noted that the guiding electric filed is generated by the p-type dopant distribution below the pixels and not between them.

The present invention also offers two improvements on the historic p+ isolation to make it more effective when it is used in combination with the deep diffused p+ region. Both improvements put the p+ deeper than it is needed for simple isolation. It is placed deep enough to intercept diffusing carriers that could lead to crosstalk. So the key is depth. In addition, the deeper p+ is connected to a more shallow p+, so the isolation function near the surface is assured and enhanced.

The present invention relates to fabricating methods and apparatuses for improving the carrier collection efficiency of a solid-state image sensor array, and to decrease the carrier cross-talk within the array.

Three different combinations are envisioned for creating sensor devices that satisfy the above objective. The first employs an imager that is fabricated in a lightly doped p-type epitaxial layer on a heavily doped p-type substrate. A high temperature thermal step, for example, is used to diffuse the p-type dopant into the epi-layer providing a gradient in the p-type doping that produces an electric field which causes photo-generated electrons to drift towards the surface and away from the p/p+ junction.

The second in addition uses deep trenches to isolate columns of pixels. The trenches are refilled with material to source a p-type dopant into the silicon substrate upon heating.

The third uses high-energy implants of a p-type dopant to create deep regions of p-type dopant in combination with the first. The high energy implants are under the isolation between columns of pixels, and may also form a part of the isolation.

These and other aspects, objects, features, and advantages of the present invention will be more clearly understood and appreciated from a review of the following detailed description of the preferred embodiments and appended claims, and by reference to the accompanying drawings.

ADVANTAGEOUS EFFECT OF THE INVENTION

The present invention has the advantages of improving the carrier collection efficiency of a solid-state sensor array and decreasing the carrier cross-talk.

BRIEF DESCRIPTION OF THE DRAWINGS

To facilitate understanding, identical reference numerals have been used, where possible, to designate identical elements that are common to the figures.

DETAILED DESCRIPTION OF THE INVENTION

Three methods are presented to improve the carrier collection efficiency of a solid-state sensor array and to decrease the carrier cross-talk.

Figure 3:
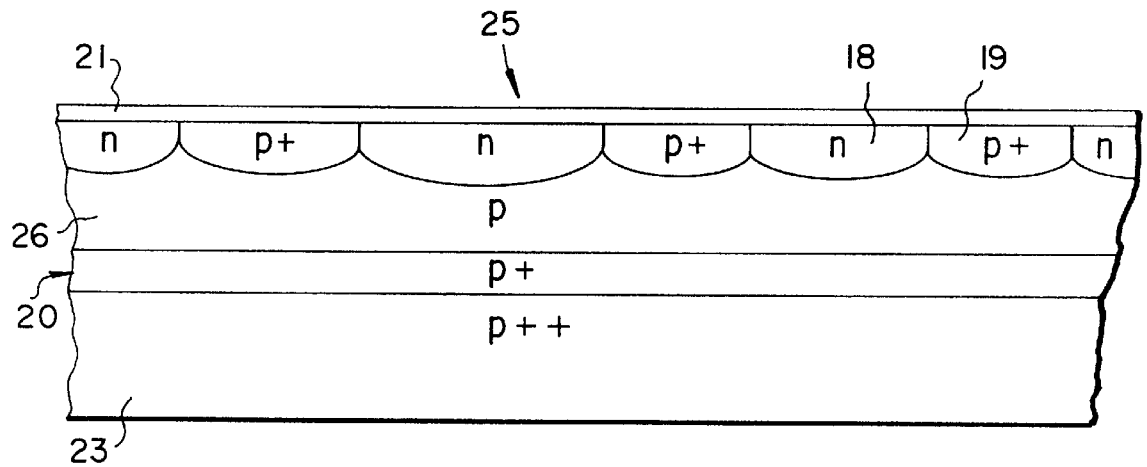
FIG. 3 is a cross sectional diagram of the present invention employing a gradient to produce an electric field.
Figure 2:
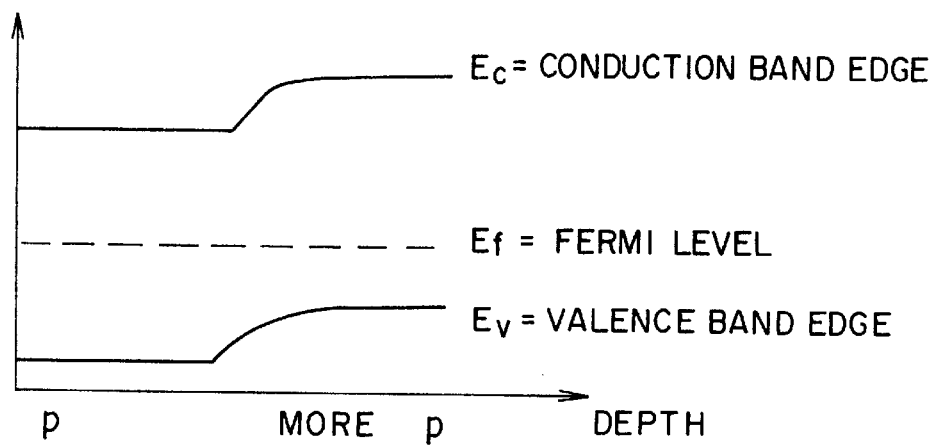
FIG. 2 is potential diagram illustrating the desired effect that is obtained by the present invention.

FIG. 3 is a cross sectional diagram of the present invention employing a gradient in the doping of the substrate 23 to produce a predetermined electric field. The substrate 23 is preferably formed having a heavily doped p-type substrate 23 with a p++ type doping level within the substrate in the range of $10^{18}$ to $10^{19}/cm^3$. A lightly doped p-type epitaxial layer 26 having a doping level of typically $10^{14}$ to $10^{16}$ is formed upon the more heavily doped p++ layer of substrate 23. The p/p++ low high dopant junction 20 between the epitaxial layer 26 and the substrate 23 will cause the photogenerated electrons to drift away from the junction 20 between the substrate 23 and the epitaxial layer 26 and towards the surface 21 of sensor 25. This movement of photogenerated electrons away from the junction 20 is further facilitated by an electric field that is generated by a gradient within the doping level concentration of the epitaxial layer 26.

The preferred method of construction of the device shown in FIG. 3 is to fabricate the imager in a lightly-doped p-type epitaxial layer 26 upon a heavily p++ doped substrate 23 and apply a high temperature thermal step to diffuse the p-type dopant into the epitaxial layer 26 from the substrate 23. This will cause a continuous gradient in the p-type doping level such that the p++ from the heavily doped substrate 23 will diffuse towards the surface 21 of the sensor 25. The gradient in the p-type doping level from p++ in the substrate 23, to p+ immediately on top and bottom of junction 20 to p-type doping within the epitaxial layer 26 results in the desired electric field to direct photogenerated electrons towards the surface 21 of sensor 25. The purpose of the electric field is to cause photo-generated electrons to drift more directly towards the surface 21 of sensor 25 and away from the junction 20 between the epitaxial layer 26 and the substrate 23. The collection efficiency is, thereby, enhanced and the cross-talk to distant pixels is lowered. The heavily-doped substrate may be replaced by a subcollector-type implant into the surface of the substrate. In addition, a profiled epitaxial layer may be grown in place of the high temperature drive step, or ion implantation may be used to provide part or all of the p+ region.

Figure 4:
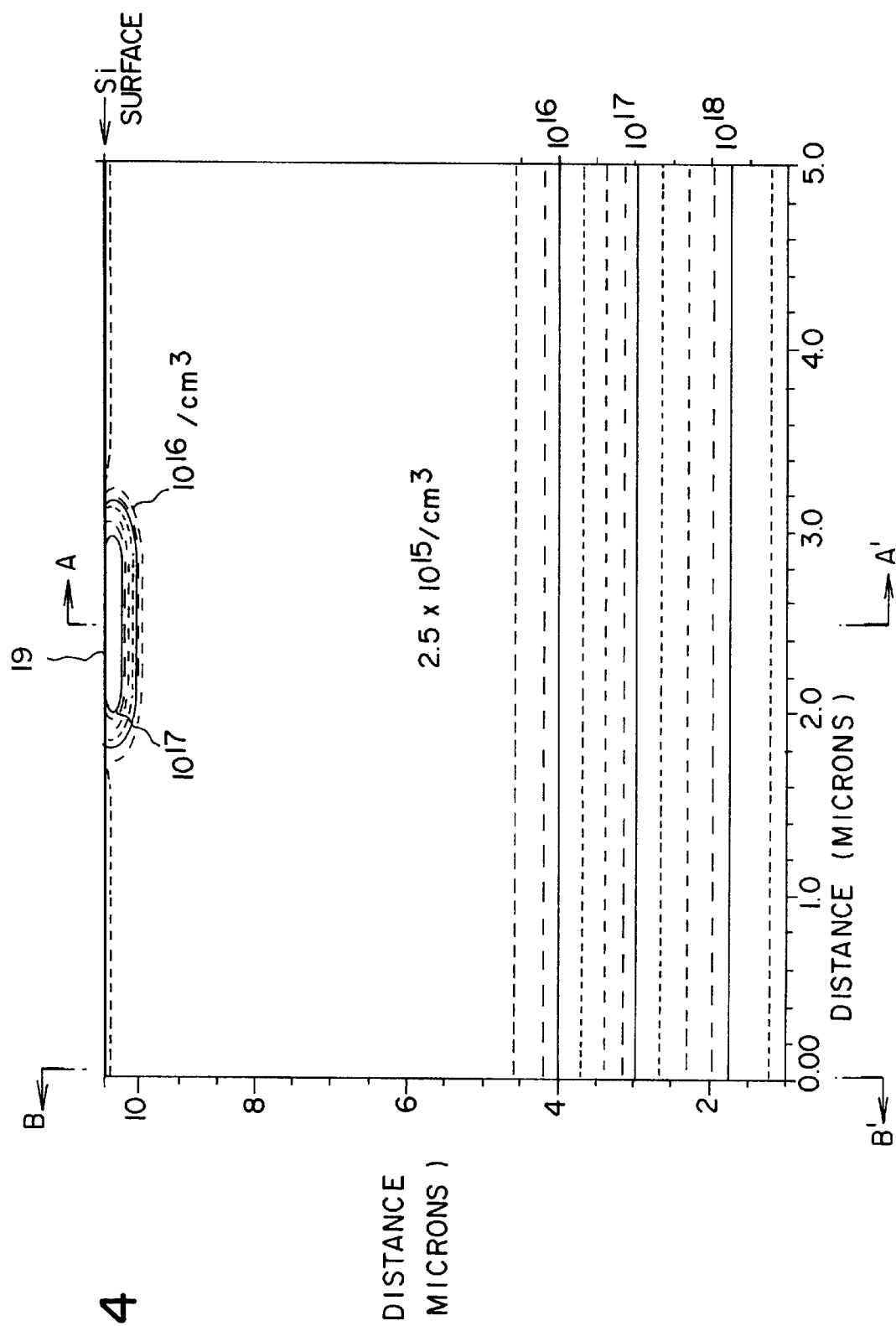
FIG. 4 shows contours of constant doping concentration.
Figure 5:
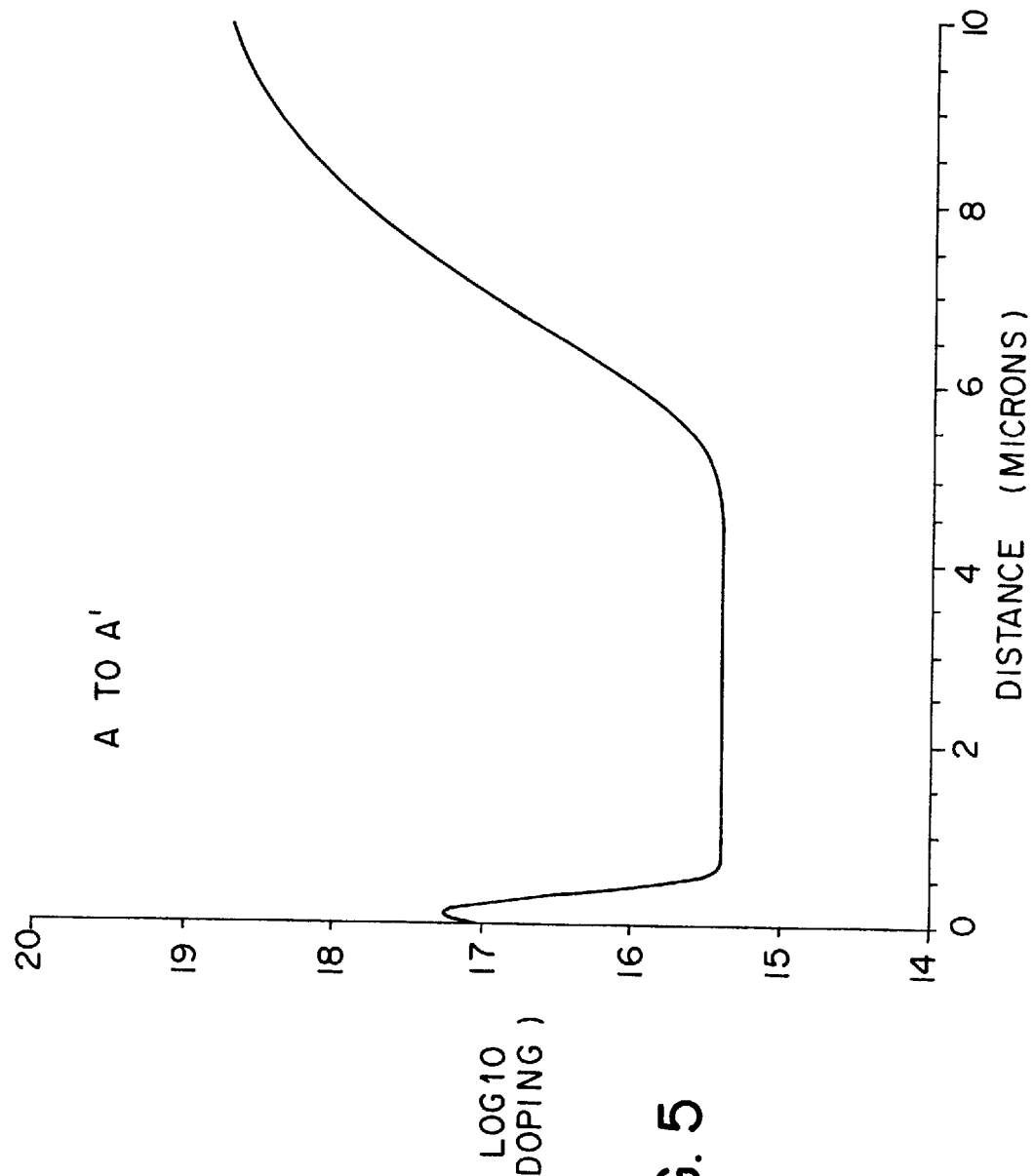
FIG. 5 is a one-dimensional profile of p-type doping from the surface into the p+ substrate through AA' of FIG. 4.
Figure 6:
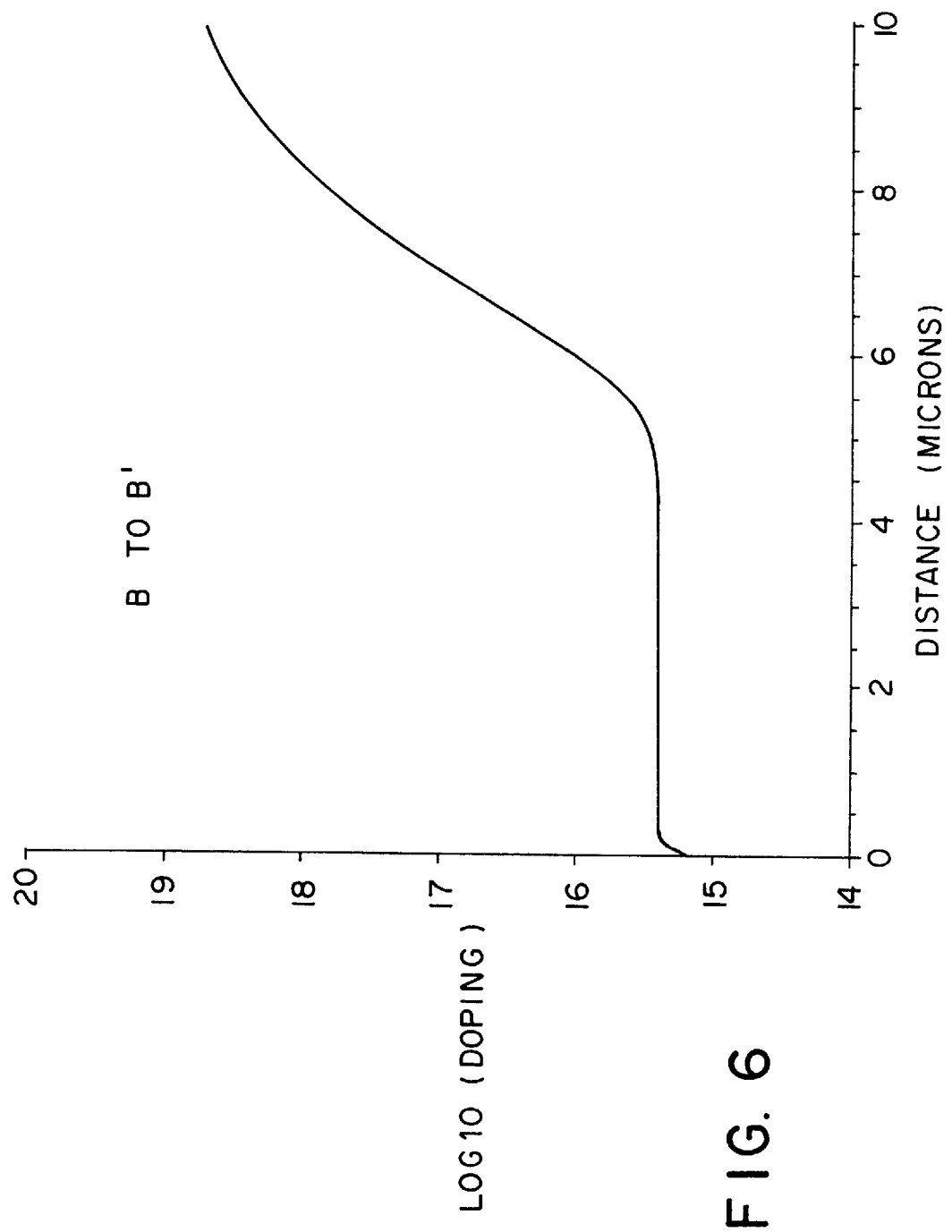
FIG. 6 is a one-dimensional profile of p-type doping from the surface into the p+ substrate through BB' of FIG. 4.

Two-dimensional process simulation is used to show the p-type dopant distribution after a high temperature diffusion step. FIG. 4 shows contours of constant doping concentration in the vicinity of an isolation region 19. FIGS. 5 and 6 are one dimensional profiles of the p-type doping from the surface into the p+ substrate. FIG. 5 is through a p+ isolation region and is along the AA' line of FIG. 4. FIG. 6 is through a region between the p+ isolation regions and is along the BB' line of FIG. 4.

Figure 1:
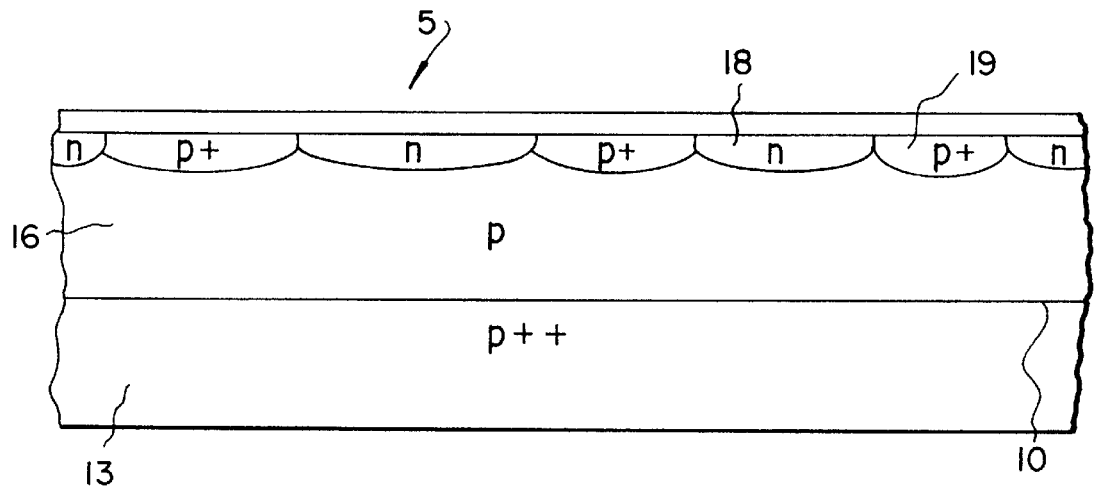
FIG. 1 is a cross sectional diagram illustrating the isolation regions employed within the prior art.
Figure 7:
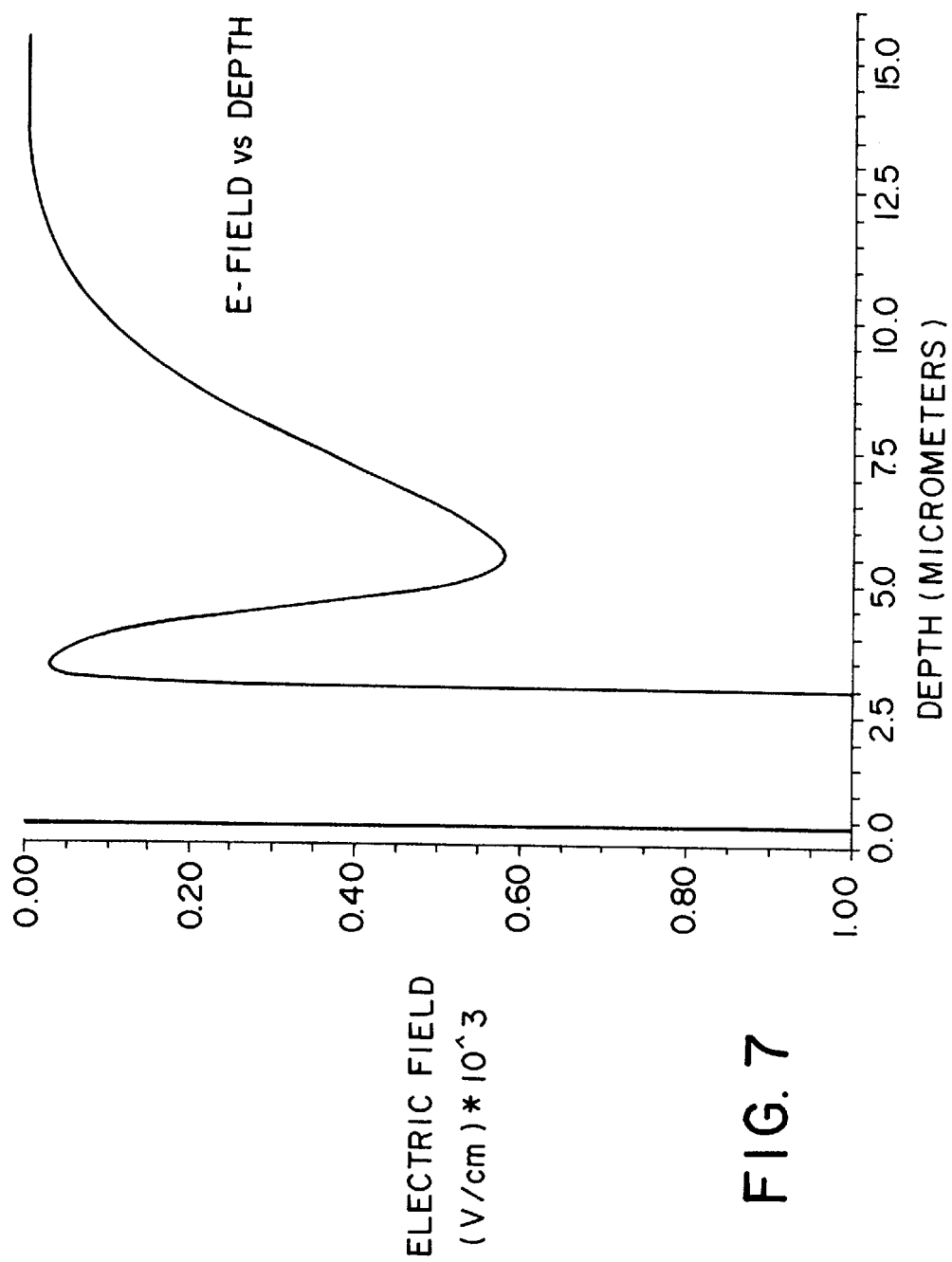
FIG. 7 is a drawing of E-field vs. silicon depth for the present invention based upon FIG. 3.
Figure 8:
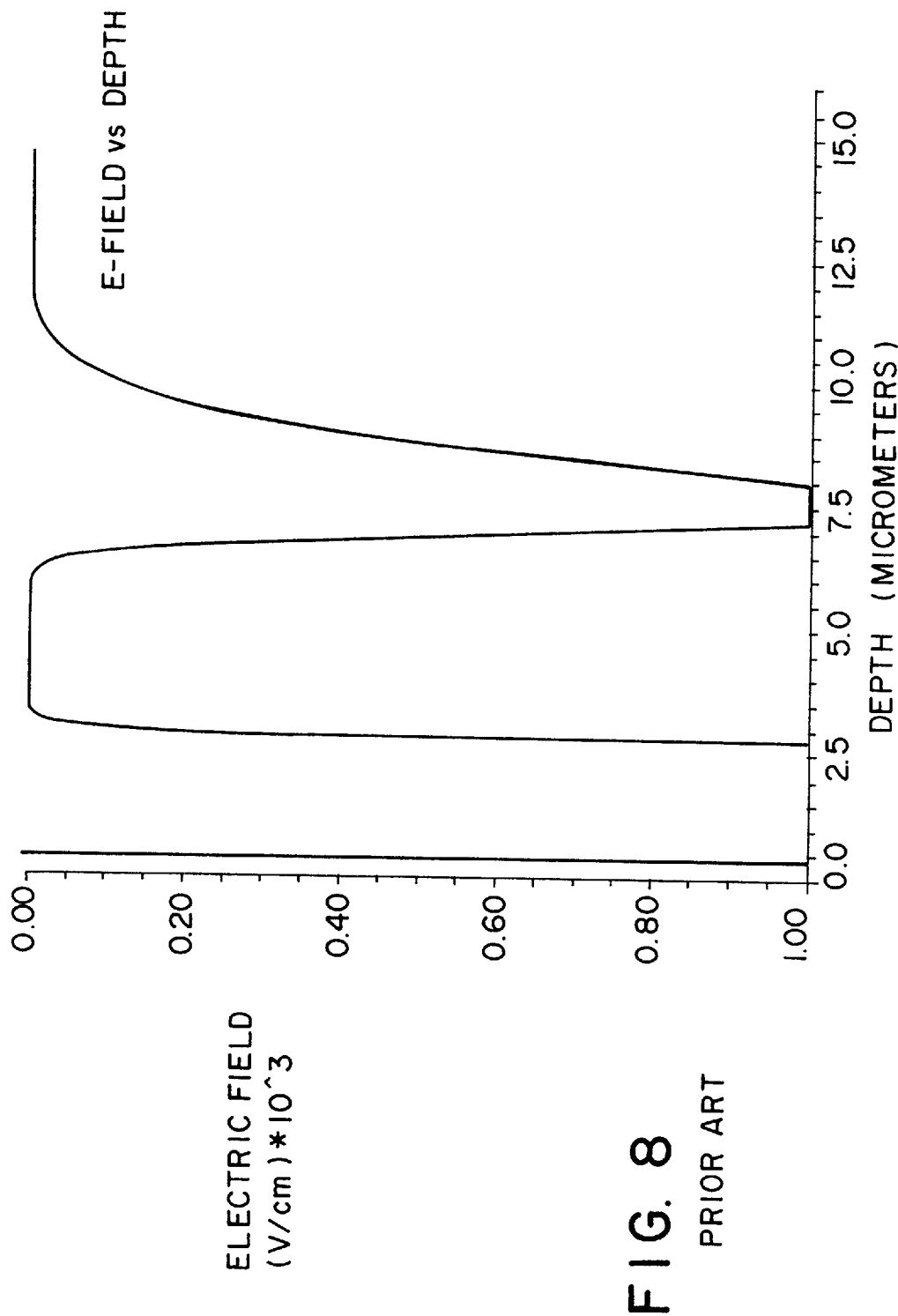
FIG. 8 is a drawing of a prior art E-field vs. silicon depth based upon FIG. 1.

FIG. 7 is a drawing of E-field vs. silicon depth for the present invention along the line BB' of FIG. 4. The calculated electric field is based upon a doping distribution similar to that of FIG. 6 The electric field is substantial over a depth of several micrometers. This is in contrast to the similar plot, shown in FIG. 8, which is based on the prior art device of FIG. 1.

Figure 9:
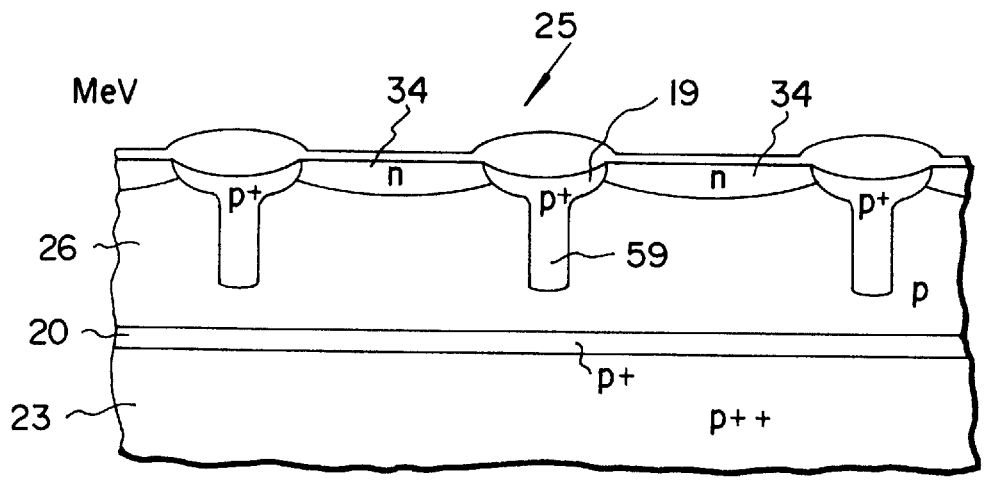
FIG. 9 is a cross sectional diagram of the present invention employing high energy implants.

Referring now to FIG. 9, which is a cross sectional diagram of the present invention employing high energy implants, an image sensing device 25 as envisioned by the present invention employs a heavily doped substrate 23 with an epitaxial layer 26 formed, thereon. This epitaxial layer 26 is envisioned as being formed as described in FIG. 3. High-energy implant 59 of a p-type dopant creates deep regions of p-type dopant. These high energy implants 59 are placed under the isolation regions 19 between pixels 34, and also form isolation regions. This method uses high-energy implants of a p-type dopant to create deep regions of p-type dopant. They function similarly to the p-type regions around the trenches shown in FIG. 10, discussed below.

Figure 10:
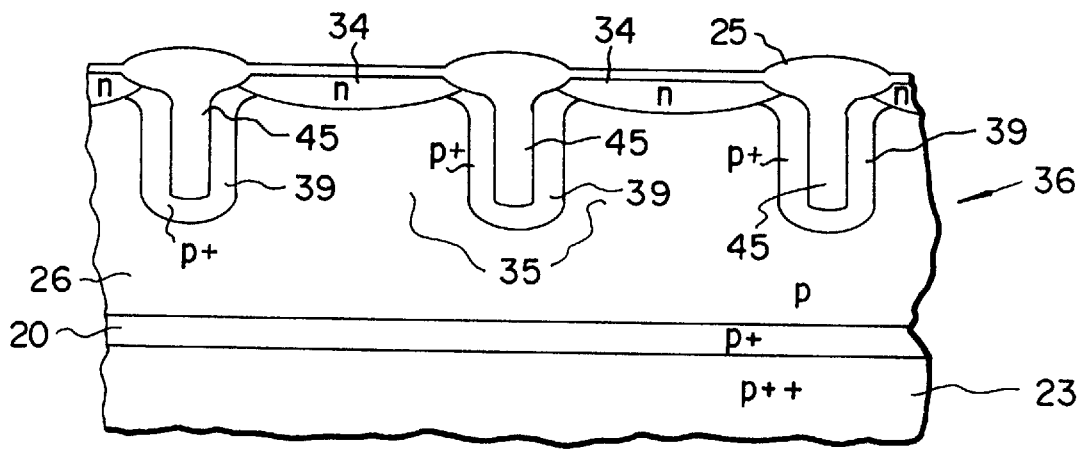
FIG. 10 is a cross sectional diagram of the present in employing trenches between columns.

Referring now to FIG. 10, a cross sectional diagram of the present invention employing trenches between columns, an image sensor 25 as envisioned by the present invention is shown having a heavily doped semiconductor substrate 23 with a lightly doped p-type epitaxial layer 26 formed on a surface of the substrate 23. A plurality of pixels 34 are formed in a series of columns 35 by implanting of an n-type dopant within the semiconductor such that there are a plurality of trenches 45, each having a pair of spaced walls, between the columns 35. The trenches 45 are then filled 39. In the preferred embodiment, a p-type dopant 39 within the trenches 45 is sourced into the epitaxial layer upon heating. This places additional p-type doping in the silicon adjacent to the trenches 45. Thus, an electric field is built-in to reflect diffusing electrons and to increase the probability they are collected by a nearby pixel.

Various combinations of the three embodiments may be used to improve imager performance. For example, as stated above, the gradient pattern discussed with FIG. 3 would be equally applicable to the devices shown in the other two embodiments.

The invention has been described with reference to a preferred embodiment; however, it will be appreciated that variations and modifications can be effected by a person of ordinary skill in the art without departing from the scope of the invention.

PARTS LIST 5 sensor
10 junction
13 substrate
16 epitaxial layer
18 charge storage regions
19 isolation regions
20 junction
21 surface
23 substrate
26 epitaxial layer
25 image sensor
26 epitaxial layer
34 pixels
35 columns
39 p-type layer
45 trenches
59 high-energy implant

What is claimed is:

1. An image sensor comprising:

a semiconductor substrate that is heavily doped of a first conductivity type having a surface with a semiconductor layer that is more lightly doped of the first conductivity type with a plurality of pixels formed within the layer from a second conductivity type that is opposite the first conductivity type; and a region doped with the first conductivity type semiconductor between the pixels such that the region extends significantly beneath the pixels within the epitaxial layer extending towards the substrate.

2. The sensor of claim 1 wherein the sensor further comprises:

the layer is as a lightly doped p-type epitaxial layer formed upon a heavily doped p-type substrate, such that a doing gradient is formed within the epitaxial layer that causes photogenerated electrons to drift away from a junction between the substrate and the epitaxial layer.

3. The image sensor of claim 2 wherein the epitaxial layer has a doping level in a range of $10^{13}$ to $10^{18}/cm^3$.

4. The image sensor of claim 2 wherein the substrate has a doping level on the order of $10^{18}$ to $10^{19}/cm^3$.

5. The image sensor of claim 1 wherein the gradient is formed using dopants from within the heavily doped region.

6. The image sensor of claim 1 further comprising:

the plurality of pixels are formed in a series of columns from an n type semiconductor dopant within a lightly doped p-type semiconductor such that there are a plurality of trenches each having a pair of spaced walls between the columns; and a layer containing p type semiconductor dopant within the trenches.

7. The image sensor of claim 1 further comprising:

the plurality of pixels are formed in a series of columns from an n type semiconductor dopant within a lightly doped p-type semiconductor such that there are a plurality of isolation regions created between the pixels formed from a series of high-energy implants of a p-type dopant to create deep regions of the p-type dopant.

8. The image sensor of claim 1 wherein the semiconductor further comprises a substrate with a p type doping level within the substrate in the range of $10^{18}$ to $10^{19}/cm^3$.

9. An image sensing device comprising:

a semiconductor substrate heavily doped of a first conductivity type having a layer formed on a surface of the substrate that is more lightly doped than the substrate forming a doping gradient;

a plurality of pixels formed within the layer; and a series of isolation regions formed between the pixels and extending significantly deeper into the layer than the pixels, the isolation regions containing a dopant of the first conductivity type that operates in conjunction with a doping gradient formed of the first conductivity type formed from varying doping levels within the substrate and the layer.

10. The image sensing device of claim 9, further comprising a series of high energy implants formed in isolation regions between the pixels, the high-energy implants being formed of the first conductivity type.

11. The image sensing device of claim 10 wherein the series of implants form a plurality of columns.

12. The image sensing device of claim 10 wherein areas between the series of implants comprise a second conductivity type semiconductor opposite the first conductivity type.

* * * * *